US012677418B2

(12) United States Patent
He et al.

(10) Patent No.: US 12,677,418 B2
(45) Date of Patent: Jul. 7, 2026

(54) THREE-DIMENSIONAL MEMORY DEVICE WITH IMPROVED SIGNAL INTERFERENCE

(71) Applicant: Fujian Jinhua Integrated Circuit Co., Ltd., Quanzhou City (CN)

(72) Inventors: Shiwei He, Quanzhou City (CN); Canfa Dai, Quanzhou City (CN); Detianyu Diao, Quanzhou City (CN); Guoguo Kong, Quanzhou City (CN); Hsien-Shih Chu, Quanzhou City (CN); Yongjian Yu, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 488 days.

(21) Appl. No.: 18/132,440

(22) Filed: Apr. 10, 2023

(65) Prior Publication Data

US 2024/0206166 A1     Jun. 20, 2024

(30) Foreign Application Priority Data

Dec. 14, 2022    (CN) .......................... 202211608690.X
Dec. 14, 2022    (CN) .......................... 202223355316.1

(51) Int. Cl.
H10B 43/27        (2023.01)
H10B 63/00        (2023.01)

(52) U.S. Cl.
CPC ........... H10B 43/27 (2023.02); H10B 63/845 (2023.02)

(58) Field of Classification Search
CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | |
|---|---|---|---|
| 11,296,110 B2 | 4/2022 | Jung | |
| 2008/0237688 A1* | 10/2008 | Yasuda | ................ H10D 64/685 257/E21.21 |
| 2010/0320528 A1* | 12/2010 | Jeong | ..................... H10B 43/20 257/E27.098 |
| 2011/0147824 A1* | 6/2011 | Son | ........................ H10B 43/20 257/324 |

(Continued)

*Primary Examiner* — William B Partridge
*Assistant Examiner* — Gustavo G Ramallo
(74) *Attorney, Agent, or Firm* — Winston Hsu

(57) ABSTRACT

A three-dimensional memory device includes a substrate and a stack structure including alternating conductive layers and dielectric layers disposed on the substrate, and a memory string structure extending vertically through the stack structure. The memory string structure includes a conductive pillar and a storage layer disposed between the conductive pillar and the stack structure and surrounding the conductive pillar. The storage layer includes a plurality of first protruding portions at interfaces between the conductive layers and the dielectric layers.

18 Claims, 8 Drawing Sheets

(56) References Cited

U.S. PATENT DOCUMENTS

| | | | |
|---|---|---|---|
| 2011/0303970 A1 * | 12/2011 | Kim | H10B 43/20 |
| | | | 257/E29.262 |
| 2012/0211820 A1 * | 8/2012 | Komori | H10D 30/693 |
| | | | 257/E21.21 |
| 2013/0134492 A1 * | 5/2013 | Yang | H10B 43/27 |
| | | | 257/314 |
| 2017/0365616 A1 | 12/2017 | Kang | |
| 2020/0328227 A1 | 10/2020 | Kang | |

* cited by examiner

THREE-DIMENSIONAL MEMORY DEVICE WITH IMPROVED SIGNAL INTERFERENCE

BACKGROUND OF THE INVENTION

1. Field of the Invention

The present invention is related to a semiconductor device. More particularly, the present invention is related to a three-dimensional memory device and a manufacturing method for forming the same.

2. Description of the Prior Art

Memory devices are indispensable and important parts in modern electronic products. In addition to memorize the user's data, the memory devices are also responsible for storing the program code executed by the central processing unit and temporary information during the operation. A memory device generally includes an array of memory cells and peripheral circuits for reading, sensing, writing or programming the memory cell. Each memory cell has two logic states that respectively represent logic 1 and logic 0 in a binary system. Memory cells for other memory systems may include more logic states.

Memory devices may be classified into volatile memory devices and non-volatile memory devices. Data stored in a volatile memory device such as a dynamic random access memory (DRAM) or a static random access memory (SRAM) is erased when the volatile memory device is out of power supply, and must be re-entered at the next power supply. On the other hand, data stored in a non-volatile memory device such as a read-only memory (ROM) or a flash memory is retained in the non-volatile memory device when the power is turned off, so that the data may be directly accessed after the power is restored. In advanced electronic products, the specification requirements such as area efficiency, read/write speed, reliability, power consumption, and manufacturing cost have become increasingly critical. The development of memory devices that fulfill the requirements is an important research topic in this field.

SUMMARY OF THE INVENTION

The present invention is directed to provide a three-dimensional (3D) memory device and a manufacturing method for forming the same. The memory cells of the memory device are arranged to form memory string structures vertically disposed on the substrate such that the area efficiency of the memory device may be improved. Furthermore, by forming recesses along sidewalls of the through-holes and filling the recesses by the storage layers to form dielectric protrusions at upper and the lower sides of the memory cells, the electrical isolation between the memory cells may be improved. Signal interference or cross-talk between memory cells of the same memory string structure during writing or reading operations may be reduced.

According to an embodiment of the present invention, a three-dimensional memory device is provided. The three-dimensional memory device includes a substrate, a stack structure disposed on the substrate and comprising a plurality of alternating conductive layers and dielectric layers, and a memory string structure extending vertically through the stack structure. The memory string structure includes a conductive pillar and a storage layer disposed between the conductive pillar and the stack structure and surrounding the conductive pillar. The storage layer includes a plurality of first protruding portions filling first recesses respectively at interfaces between the conductive layers and the dielectric layers.

According to an embodiment of the present invention, a method for forming three-dimensional memory device is provided. A substrate is provided. A stack structure comprising a plurality of alternating conductive layers and dielectric layers is formed on the substrate. An etching process is then performed to form a through-hole extending vertically through the stack structure, wherein a sidewall of the through-hole has a plurality of first recesses respectively at interfaces between the conductive layers and the dielectric layers. A storage layer is formed along the sidewall of the through-hole and filling the first recesses. A conductive pillar is formed on the storage layer and filling the through-hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to enhance the understanding of the embodiments and are included as parts of the specification of the present invention. These drawings and descriptions are intended to illustrate the principles of the embodiments. It should be noted that all drawings are schematic, and the relative dimensions and scales have been adjusted for ease of illustration. Identical or similar features in different embodiments are marked with identical symbols.

FIG. 3 is a partial enlarged view of FIG. 2. FIG. 7 is a partial enlarged view of FIG. 6.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
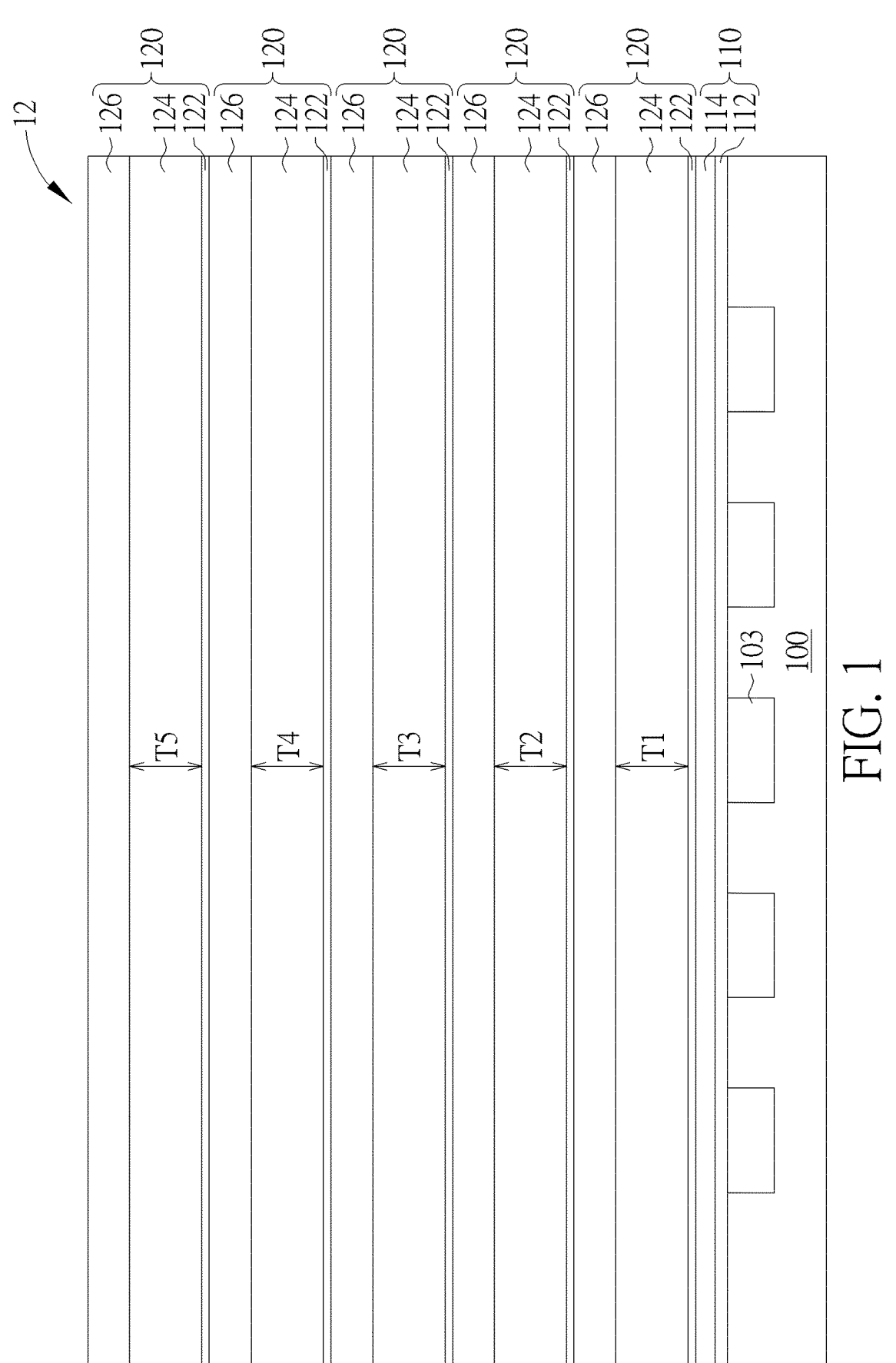
FIG. 1 to FIG. 7 are schematic diagrams illustrating the manufacturing steps of a method for forming a three-dimensional (3D) memory device according to an embodiment of the present invention.

FIG. 1 to FIG. 7 are schematic diagrams illustrating the manufacturing steps of a method for forming a three-dimensional (3D) memory device according to an embodiment of the present invention. As shown in FIG. 1, a substrate 100 is provided. A pad layer 110 is formed on the substrate 100 and a stack structure 12 including a plurality of alternating conductive layers 124 and dielectric layers 126 is then formed on the pad layer 110.

Figure 6:
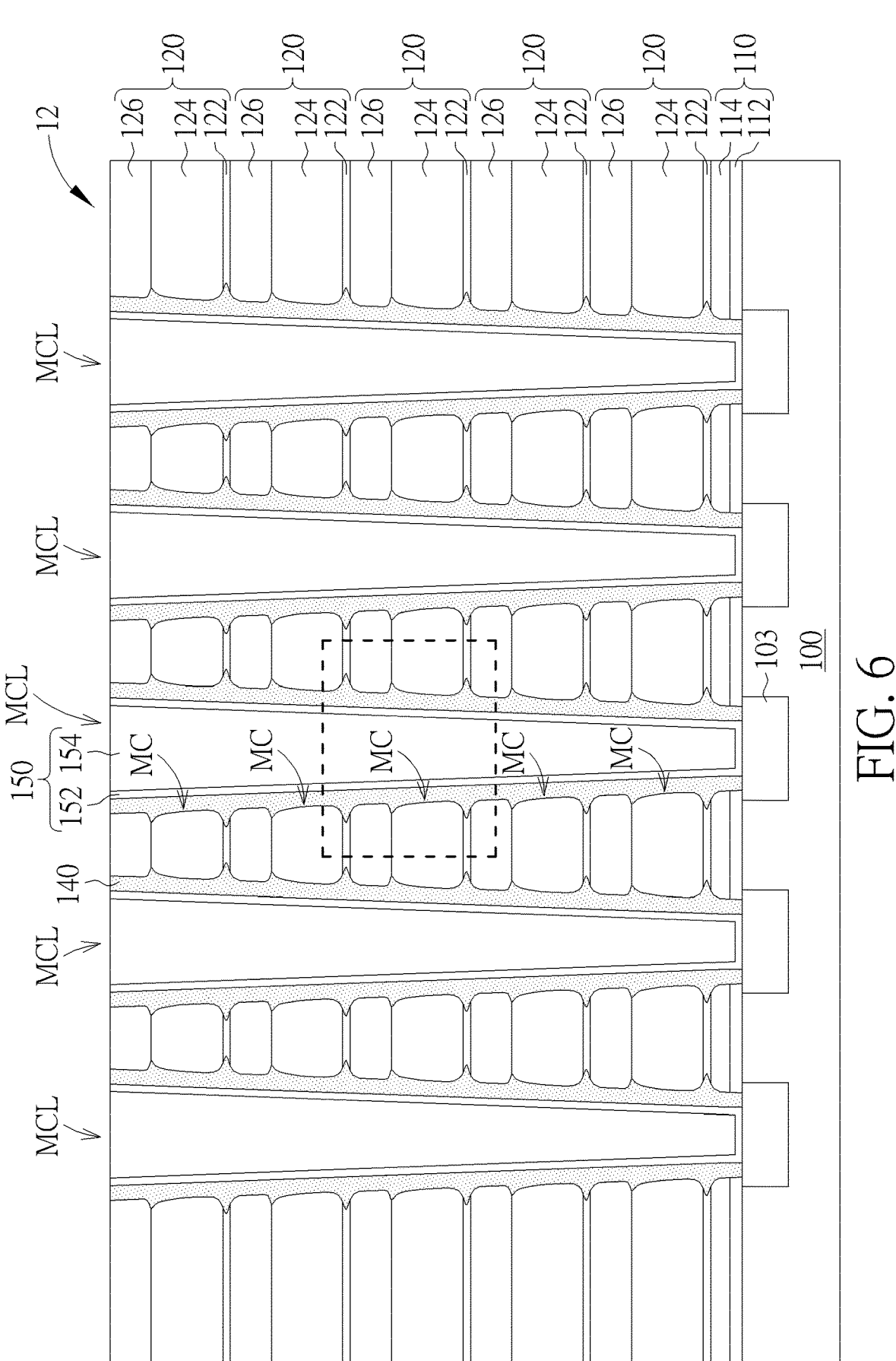

The substrate 100 may include a semiconductor substrate having circuit components and interconnection structures that have been fabricated on the semiconductor substrate through semiconductor manufacturing processes. The semiconductor substrate may be a silicon (Si) substrate, an epitaxial silicon substrate, a silicon germanium (SiGe) substrate, a silicon carbide (SiC) substrate, or a silicon-on-insulator (SOI) substrate, but is not limited thereto. The circuit components may include active or passive components such as transistors, diodes, resistors, capacitors, but are not limited thereto. The interconnection structures may include interlayer dielectric layers and conductive structures such as metal interconnections, contact plugs, and conductive pads formed in the interlayer dielectric layers. In some embodiments, as shown in FIG. 1, a plurality of separated contact pads 103 are disposed on the surface of the substrate 100 to electrically connect the circuit components in the substrate 100 and the subsequently formed components (such as the memory string structures MCL as shown in FIG. 6) on the substrate 100. The contact pads 103 are made of conductive metals such as tungsten (W), copper (Cu), aluminum (Al), titanium (Ti), tantalum (Ta), or compounds, alloys, composite layers of the above metals, but is not limited thereto. According to an embodiment of the invention, the contact pads 103 are mainly made of tungsten (W).

The pad layer 110 may be made of a single dielectric layer or be made of a plurality of dielectric layers. Suitable dielectric materials for the pad layer 110 may include silicon oxide ($SiO_2$), silicon nitride (SiN), silicon oxynitride (SiON), silicon carbide nitride (SiCN), high dielectric constant (high-k) materials such as metal oxide dielectrics including hafnium oxide ($HfO_2$), hafnium silicon oxide ($HfSiO_4$), hafnium silicon oxynitride (HfSiON), aluminum oxide (AlO) zinc oxide ($ZrO_2$), titanium oxide ($TiO_2$), or a combination of the above materials, but are not limited thereto. According to an embodiment of the present invention, as shown in FIG. 1, the pad layer 110 is a composite layer composed of a metal oxide layer 112 (such as an aluminum oxide layer) and a silicon oxide layer 114. The metal oxide layer 112 is the lower layer of the pad layer 110 to cover the surfaces of the contact pads 103. In other embodiments, the pad layer 110 may be made of a single metal oxide layer.

In the stack structure 12, every conductive layer 124 and the dielectric layer 126 above the conductive layer 124 are referred to as a conductive-dielectric layer pair 120. The number of conductive-dielectric layer pairs 120 of the stack structure 12 may be adjusted according to design requirements. For example, the stack structure 12 may include 5 to 10 conductive-dielectric layer pairs 120, but is not limited thereto. The conductive layers 124 are made of a conductive metal, a metal component, a metal alloy, or a non-metal conductive material, such as such as aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), titanium tungsten (Ti/W), titanium and titanium nitride (Ti/TiN), poly silicon, doped silicon, silicide, or a combination thereof, but is not limited thereto. According to an embodiment of the present invention, the conductive layers 124 are mainly made of tungsten (W).

The dielectric layers 126 are made of a dielectric material, such as silicon oxide ($SiO_2$), silicon nitride (SiN), silicon oxynitride (SiON), or any combination thereof, but is not limited thereto. According to an embodiment of the invention, the dielectric layers 126 are made of silicon oxide ($SiO_2$). In some embodiments, the conductive layers 124 are formed in a way that the thicknesses of the conductive layers 124 are gradually increased as being closer to the upper of the stack structure 12. That is, a thickness of an upper one of adjacent two of the conductive layers 124 is larger than a thickness of a lower one of the adjacent two of the conductive layers 124. For example, as shown in FIG. 1, the conductive layers 124 from the top to the bottom of the stack structure 12 have a thickness T5, T4, T3, T2 and T1, respectively, and T5>T4>T3>T2>T1.

The pad layer 110, the conductive layers 124 and the dielectric layers 126 of the stack structure 12 may be formed on the substrate 100 by respectively performing any suitable deposition processes, such as chemical vapor deposition process, physical vapor deposition process, atomic layer deposition process, or sputtering. In some embodiments, the stack structure 12 further includes a plurality of interfacial layers 122 formed on the upper surfaces of the dielectric layers 126 to serve as the seed layers upon which the conductive layers 124 are formed. The interfacial layers 122 may adjust crystallization state and grain size of the conductive layers 124, such that a desired resistivity of the conductive layers 124 may be obtained. In some embodiments, the interfacial layers 122 also serve as barrier layers to prevent reactive chemicals of the deposition processes from diffusing into the stack structure 12 and causing reliability impact on the device. The material of the interfacial layers 122 may include tantalum (Ta), tantalum nitride (TaN), titanium (Ti), titanium nitride (TiN), titanium tungsten (TiW), titanium silicon (TiSi), tungsten nitride (WN), tungsten silicide (WSi), tungsten silicide nitride (WSiN), tungsten carbide nitride (WCN), or a combination thereof, but is not limited thereto. According to an embodiment of the invention, the material of the interfacial layer 122 may include tungsten silicide (WSi).

Figure 2:
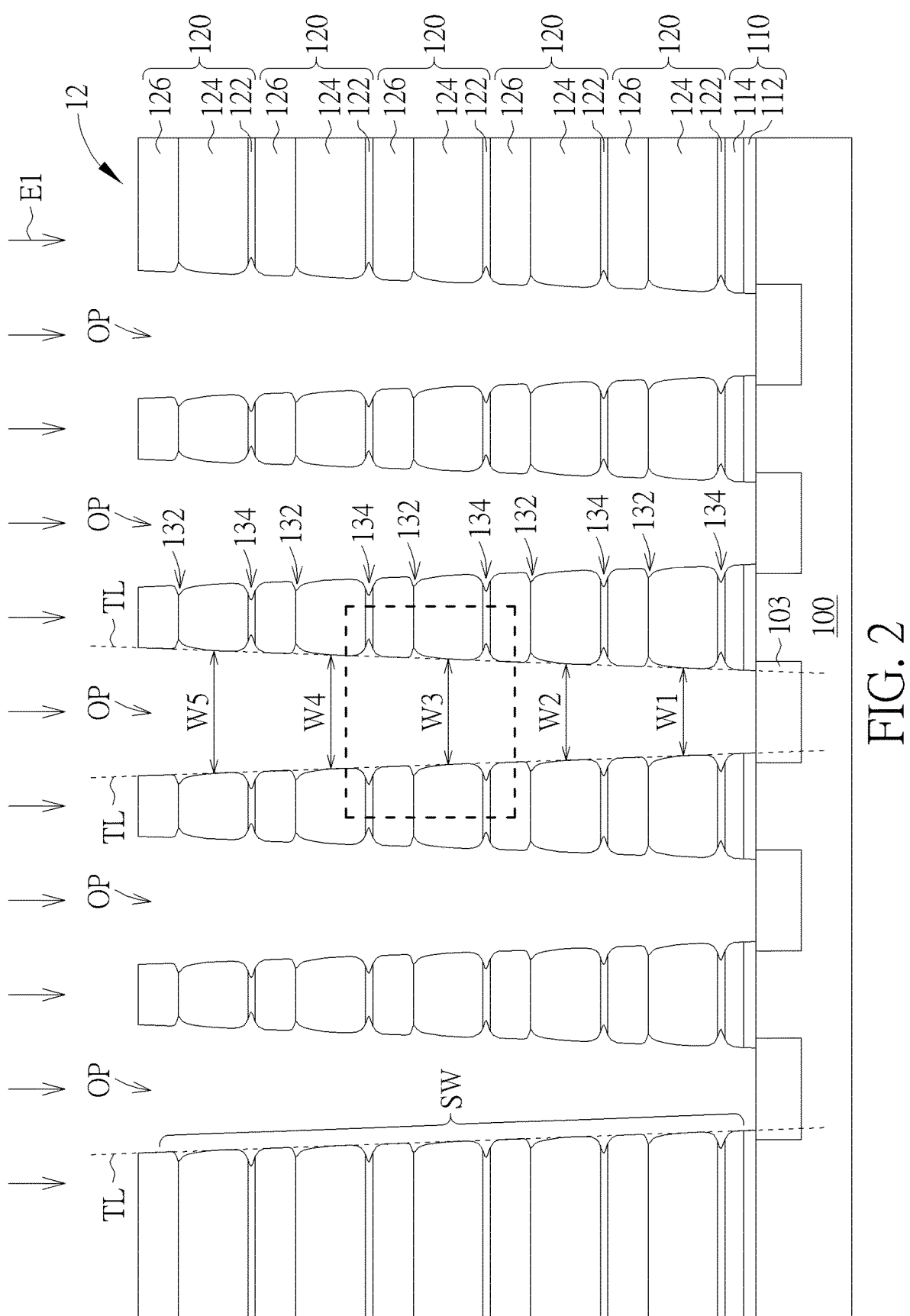
Figure 3:
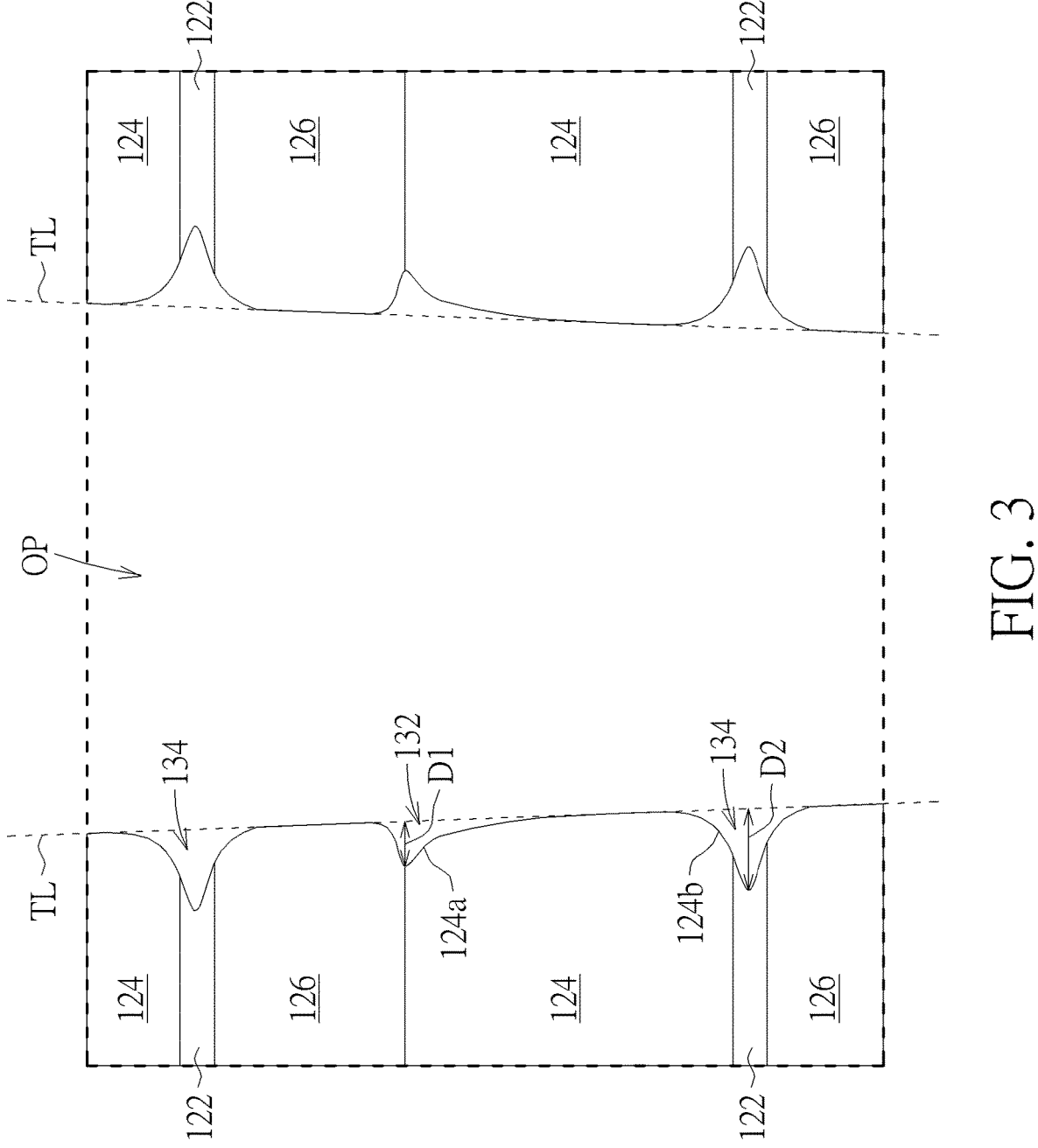

Please refer to FIG. 2 and FIG. 3. Subsequently, an etching process E1 such as a plasma etching process or a reactive ion etching (RIE) process is performed to etch the stack structure 12, thereby forming a plurality of through-holes OP that extend vertically through the stack structure 12 and are respectively aligned with the contact pads 103. In some embodiments, the bottom ends of the through-holes OP may penetrate through the pad layer 110 to expose the contact pads 103. In some embodiments, the bottom ends of the through-holes OP may stop on the surface of the pad layer 110, without exposing any portion of the contact pads 103. In this case, the remaining pad layer 110 at the bottom ends of the through-holes OP may be etched and removed by another etching step (such as the etching process E2 shown in FIG. 5) to expose the contact pads 103. The through-holes OP are substantially circular holes (thereby forming circular-pillar-shaped memory string structures MCL), but is not limited thereto. In some embodiments, the width of each of the through-holes OP is gradually reduced from top to bottom. The width of the top portion (the portion away from the substrate 100) of each through-hole OP is larger than the width of the bottom portion (the portion close to the substrate 100) of each through-hole OP. For example, as shown in FIG. 2, the widths of the portions of one of the through-holes OP through different conductive layers 124 (from the top to the bottom) are W5, W4, W3, W2 and W1, and W5>W4>W3>W2>W1. The straight line TL that is approximately tangent to the sidewalls of the conductive layers 124 exposed from the sidewall SW of the through-hole OP is tapered with respect to the surface of the substrate 100.

It is noteworthy that, the etching process E1 may be adjusted or an additional wet etching process may be performed after the etching process E1 to particularly increase the lateral etching amounts at the interfaces between different material layers of sidewalls SW of the through-holes OP, thereby forming a plurality of first recesses 132 at the interfaces between the conductive layers 124 and the dielectric layers 126 and a plurality of second recesses 134 at the interfacial layers 122 between the conductive layers 124 and the dielectric layer 126. In some embodiments, the lateral etching amounts at the interfacial layers 122 are more than the lateral etching amounts at the interfaces between the conductive layers 124 and the dielectric layers 126, such that the second recesses 134 may be recessed into the stack structure 12 deeper than the first recesses 132.

For example, as shown in FIG. 3, when using the straight line TL as a reference line to measure the depths of the first recess 132 and the second recess 134, the first recess 132 may have a depth D1, the second recess 134 may have a depth D2, and the depth D2 may be larger than or equal to the depth D1. The top corner 124a and the bottom corner 124b of the conductive layer 124 that are exposed from the first recess 132 and the second recess 134 may respectively have rounded profiles.

Figure 4:
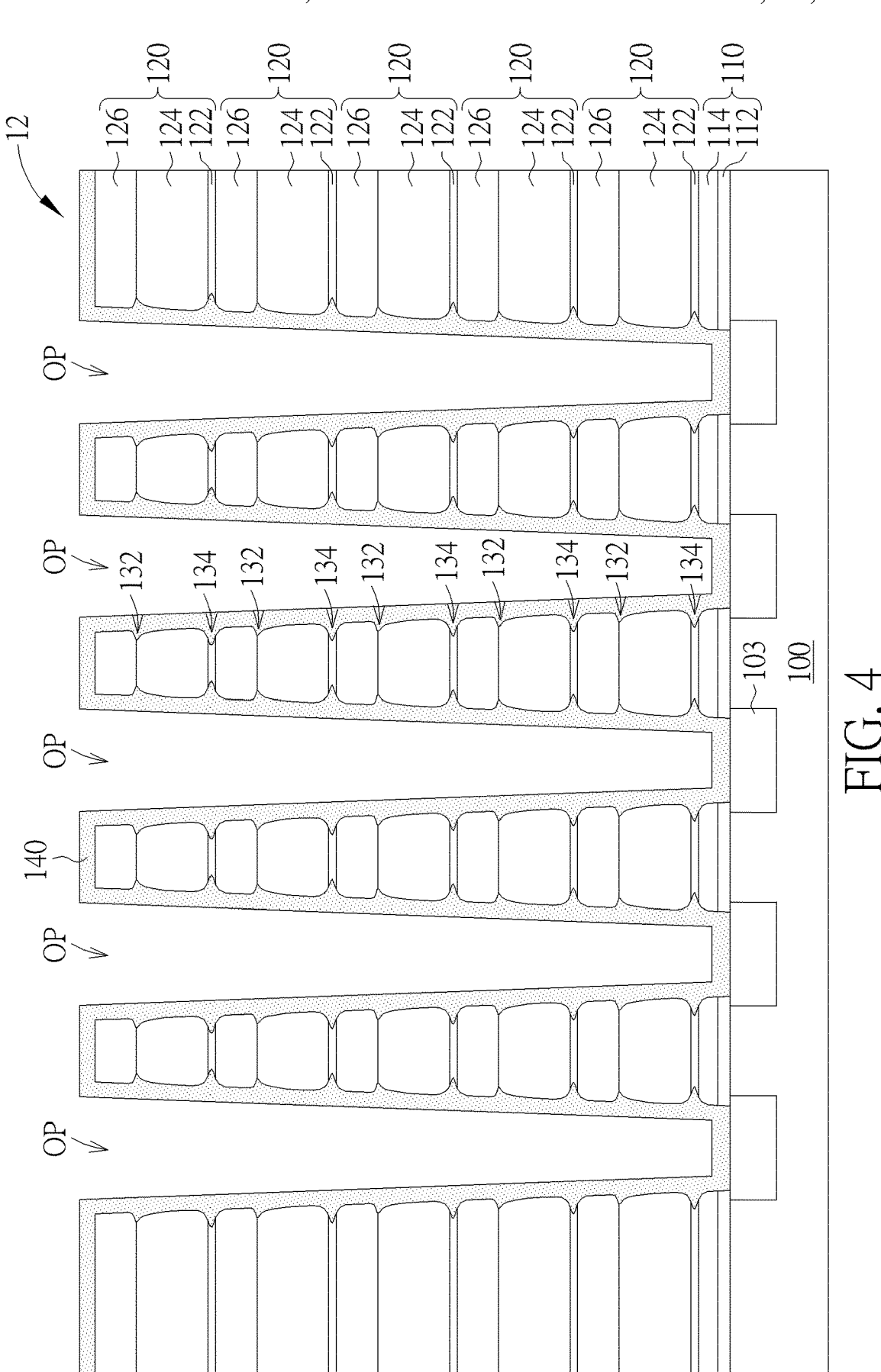

Please refer to FIG. 4. Following, a deposition process such as a chemical vapor deposition process, a physical vapor deposition process, an atomic layer deposition process, or a sputtering deposition process may be performed to form a storage layer 140 on the stack structure 12, conformally covering the sidewalls SW and bottom surfaces of the through-holes OP and filling the first recesses 132 and the second recesses 134. When the bottom ends of the through-holes OP extend through the pad layer 110 and expose the contact pads 103, as shown in FIG. 4, the storage layer 140 may directly contacts the contact pads 103.

The material of the storage layer 140 is selected according to the types of the memory cells, and may include a single-layer or multi-layer structure. In some embodiments, the storage layer 140 includes dielectric materials, such as silicon oxide ($SiO_2$), silicon nitride (SiN), silicon oxynitride (SiON), silicon carbide nitride (SiCN), high dielectric constant (high-k) materials such as metal oxide dielectrics including hafnium oxide ($HfO_2$), hafnium silicon oxide ($HfSiO_4$), hafnium silicon oxynitride (HfSiON), aluminum oxide (AlO) zinc oxide ($ZrO_2$), titanium oxide ($TiO_2$), or a combination of the above, but is not limited thereto. According to an embodiment of the present invention, the storage layer 140 may include a high-k dielectric material or an oxide-nitride-oxide (ONO) composite layer to form a memory device that store data by storing charges in the storage layer 140 of the memory cells. According to an embodiment of the present invention, the storage layer 140 may be made of a phase-change material such as chalcogenide alloy to form a phase-change memory device (PCM). According to an embodiment of the present invention, the storage layer 140 may be made of a variable-resistance material such as transition metal oxides to form a resistive memory device (ReRAM).

Figure 5:
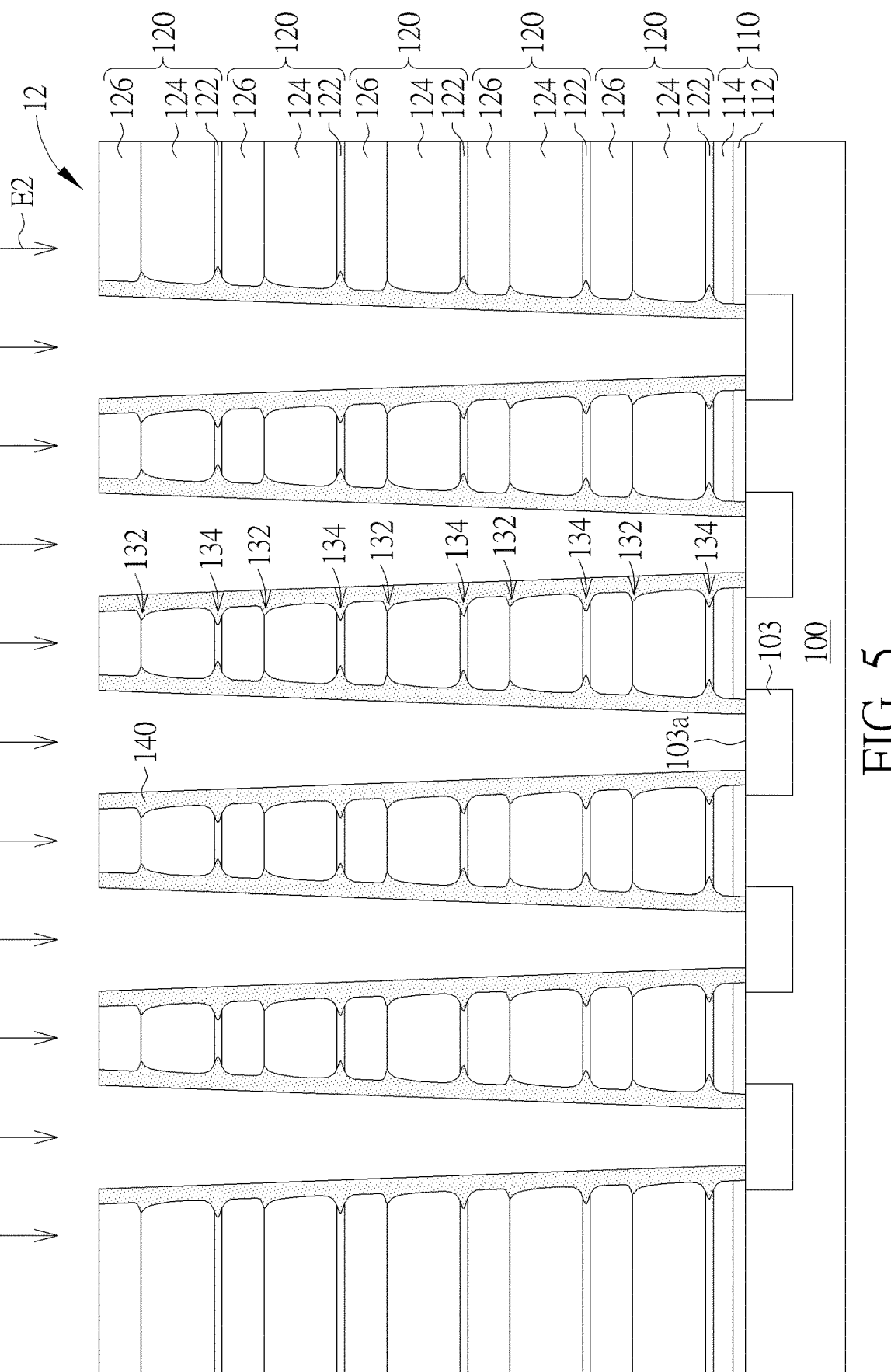

Please refer to FIG. 5. Subsequently, an etching process E2 such as a plasma etching process or a reactive ion etching (RIE) process is performed to etch away the portions of the storage layer 140 on the upper surface of the stack structure 12 and on the bottom surfaces of the through-holes OP to expose the surfaces 103a of the contact pads 103.

Figure 7:
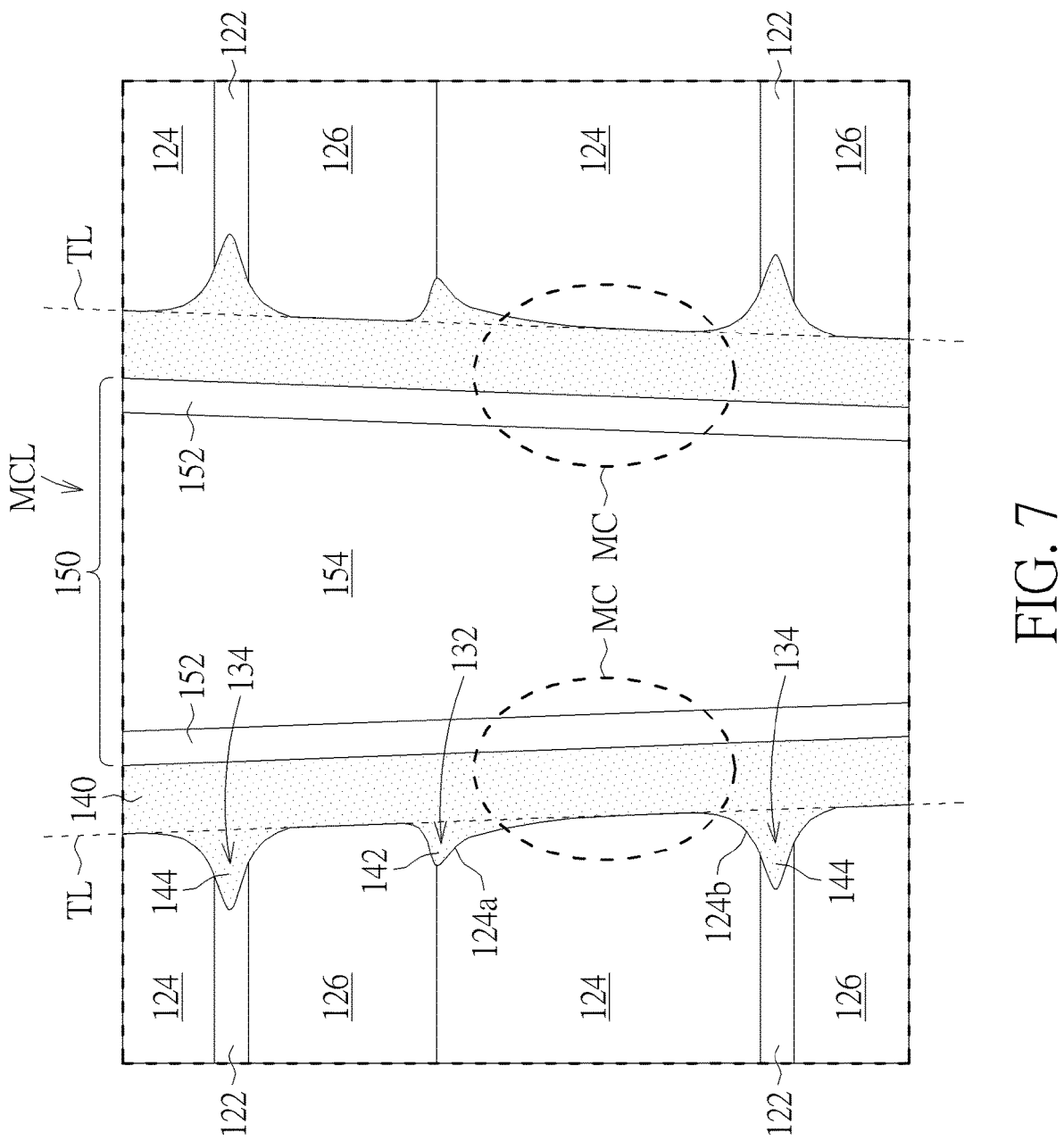
Figure 8:
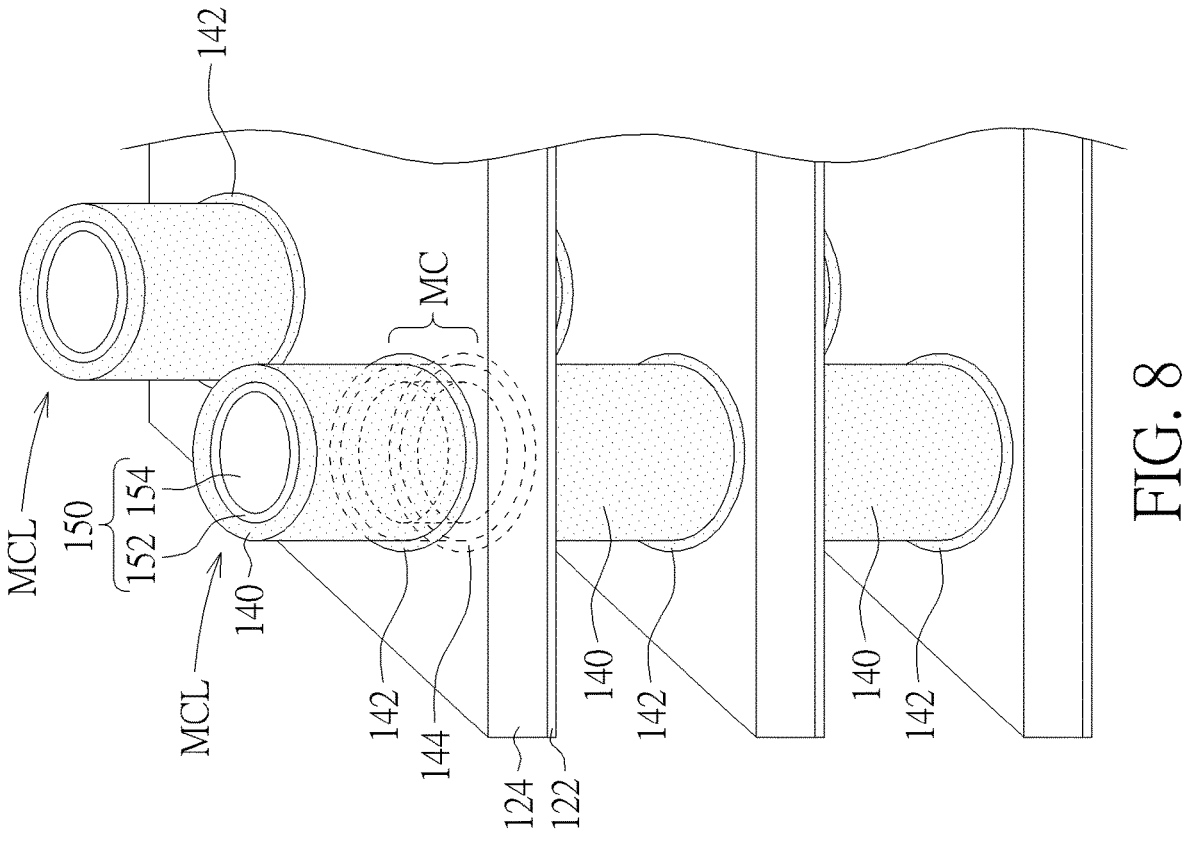
FIG. 8 is a schematic partial perspective view of the three-dimensional memory device shown in FIG. 6.

Please refer to FIG. 6, FIG. 7, and FIG. 8. Subsequently, a deposition process such as a chemical vapor deposition process, a physical vapor deposition process, an atomic layer deposition process, or a sputtering deposition process may be performed to form a conformal barrier layer 152 covering the storage layer 140 on the sidewalls SW of the through-holes OP and the surfaces 103a of the contact pads 103, and a conductive material 154 on the barrier layer 152 and completely filling the through-holes OP. Following, an etching process or a polishing process may be performed to remove the barrier layer 152 and the conductive material 154 outside the through-holes OP, thereby forming a plurality of conductive pillars 150 that are respectively disposed in the through-holes OP. Accordingly, a plurality of memory string structures MCL respectively disposed in the through-holes OP are obtained.

The barrier layer 152 may include tantalum (Ta), tantalum nitride (TaN), titanium (Ti), titanium nitride (TiN), titanium tungsten (TiW), titanium silicon (TiSi), tungsten nitride (WN), tungsten silicide (WSi), tungsten silicide nitride (WSiN), tungsten carbide nitride (WCN), or a combination thereof, but is not limited thereto. According to an embodiment of the invention, the material of the barrier layer 152 may include titanium nitride (TIN).

The conductive material 154 may include a metal, a metal component, a metal alloy, or a non-metal conductive material, such as such as aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), titanium tungsten (Ti/W), titanium and titanium nitride (Ti/TiN), poly silicon, doped silicon, silicide, or a combination thereof, but is not limited thereto. According to an embodiment of the invention, the conductive material 154 includes tungsten (W). In other embodiments of the present invention, the memory device may be a NAND flash memory and the conductive material 154 may include a semiconductor material such as poly silicon.

Please still refer to FIG. 6, FIG. 7, and FIG. 8. After completing the aforementioned process steps, the three-dimensional memory device according to the embodiment of the present invention is obtained. The three-dimensional memory device includes a substrate 100, a plurality of separate contact pads 103 arranged in the substrate 100 and exposed from a surface of the substrate 100, a stack structure 12 including a plurality of alternating conductive layers 124 and dielectric layers 126 disposed on the substrate 100, and a plurality of memory string structures MCL extending vertically through the stack structure 12 and respectively directly contacting the contact pads 103.

As shown in FIG. 6, each memory string structure MCL may include a conductive pillar 150 and a storage layer 140, wherein the storage layer 140 is disposed between the conductive pillar 150 and the stack structure 12 and completely surrounds the conductive pillar 150. In some embodiments of the present invention, since the width of each of the through-holes OP is gradually reduced from top to bottom, the width of the memory string structure MCL is also gradually reduced from top to bottom. The width of the top portion (the portion away from the substrate 100) of the memory string structure MCL is larger than the width of the bottom portion (the portion close to the substrate 100) of the memory string structure MCL. The portions of the storage layer 140 sandwiched between the conductive pillar 150 and the conductive layers 124 are the memory cells MC (see FIG. 7) of the three-dimensional memory device. The status (such as charged/discharged status or high/low resistance status) of the memory cells MC may be controlled respectively by the electric fields applied to the memory cells MC by the corresponding conductive layers 124 and the conductive pillar 150, thereby achieving the purpose of storing data. It is noteworthy that, the storage layer 140 of the memory string structure MCL includes a plurality of first protruding portions 142 and a plurality of second protruding portions 144 that are formed by filling the first recesses 132 and the second recesses 134 with the storage layer 140. The first protruding portions 142 are at upper sides of the memory cells MC. The second protruding portions 144 are at lower sides of the memory cells MC. In some embodiments of the present invention, as shown in FIG. 8, the memory cells MC, the first protruding portions 142 and the second protruding portions 144 of a memory string structure MCL are closed-ring structures surrounding the conductive pillar 150 of the memory string structure MCL. The first protruding portions 142 and the second protruding portions 144 may improve electrical isolation between the memory cells MC, so that signal interference between adjacent memory cells MC may be reduced. Furthermore, by forming the rounded top corners 124*a* and bottom corners 124*b* of the conductive layers 124, damages of the storage layer 140 due to large electric fields particularly near the corners of the conductive layers 124 may be reduced, and device reliability may be improved.

In conclusion, the three-dimensional memory device provided by the present invention has the memory cells vertically arranged to form memory string structures vertically disposed on the substrate, such that the area efficiency of the memory device may be improved. Furthermore, by forming recesses along sidewalls of the through-holes and filling the recesses with the storage layers to form dielectric protruding portions at upper and the lower sides of the memory cells before the memory string structure MCL is formed in the through-holes, the electrical isolation between the memory cells may be improved. Signal interference or cross-talk between memory cells during writing or reading operations may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional memory device, comprising:
a substrate;
a stack structure disposed on the substrate and comprising
a plurality of alternating conductive layers and dielectric layers; and
a memory string structure extending vertically through the stack structure, and comprising:
a conductive pillar; and
a storage layer disposed between the conductive pillar and the stack structure and surrounding the conductive pillar, wherein the storage layer comprises a plurality of first protruding portions filling first recesses respectively at interfaces between the conductive layers and the dielectric layers, wherein the conductive layers and the dielectric layers are in direct contact with each other at the interfaces.

2. The three-dimensional memory device according to claim 1, wherein the stack structure further comprises a plurality of interfacial layers between bottom surfaces of the conductive layers and top surfaces of the dielectric layers.

3. The three-dimensional memory device according to claim 2, wherein the storage layer further comprises a plurality of second protruding portions filled in second recesses between the interfacial layers, the conductive layers and the dielectric layers, wherein a depth of the second recesses is larger than a depth of the first recesses.

4. The three-dimensional memory device according to claim 2, wherein the conductive layers and the conductive pillar comprise tungsten, the interfacial layers comprise tungsten silicide, and the dielectric layers comprise silicon oxide.

5. The three-dimensional memory device according to claim 1, further comprising:
a contact pad disposed in the substrate; and
a pad layer disposed between the stack structure and the substrate, wherein the memory string structure extends through the pad layer to directly contact the contact pad.

6. The three-dimensional memory device according to claim 5, wherein the pad layer comprises a metal oxide layer.

7. The three-dimensional memory device according to claim 1, wherein the storage layer comprises a high-k dielectric material.

8. The three-dimensional memory device according to claim 1, wherein corners of the conductive layers that are in direct contact with the first protruding portions have rounded profiles.

9. The three-dimensional memory device according to claim 1, wherein the memory string structure comprises a top portion near a top surface of the stack structure and a bottom portion near a bottom surface of the stack structure that is close to the substrate, and a width of the top portion is larger than a width of the bottom portion.

10. The three-dimensional memory device according to claim 1, wherein a thickness of an upper one of adjacent two of the conductive layers is larger than a thickness of a lower one of the adjacent two of the conductive layers.

11. A three-dimensional memory device, comprising:
a substrate;
a stack structure disposed on the substrate and comprising
a plurality of alternating conductive layers and dielectric layers, and a plurality of interfacial layers between bottom surfaces of the conductive layers and top surfaces of the dielectric layers; and
a memory string structure extending vertically through the stack structure, and comprising:
a conductive pillar; and
a storage layer disposed between the conductive pillar and the stack structure and surrounding the conductive pillar, wherein the storage layer comprises a plurality of first protruding portions filling first recesses respectively at interfaces between the conductive layers and the dielectric layers, wherein the conductive layers and the conductive pillar comprise tungsten, the interfacial layers comprise tungsten silicide, and the dielectric layers comprise silicon oxide.

12. The three-dimensional memory device according to claim 11, wherein the storage layer further comprises a plurality of second protruding portions filled in second recesses between the interfacial layers, the conductive layers and the dielectric layers, wherein a depth of the second recesses is larger than a depth of the first recesses.

13. The three-dimensional memory device according to claim 11, further comprising:
a contact pad disposed in the substrate; and
a pad layer disposed between the stack structure and the substrate, wherein the memory string structure extends through the pad layer to directly contact the contact pad.

14. The three-dimensional memory device according to claim 13, wherein the pad layer comprises a metal oxide layer.

15. The three-dimensional memory device according to claim 11, wherein the storage layer comprises a high-k dielectric material.

16. The three-dimensional memory device according to claim 11, wherein corners of the conductive layers that are in direct contact with the first protruding portions have rounded profiles.

17. The three-dimensional memory device according to claim 11, wherein the memory string structure comprises a top portion near a top surface of the stack structure and a bottom portion near a bottom surface of the stack structure that is close to the substrate, and a width of the top portion is larger than a width of the bottom portion.

18. The three-dimensional memory device according to claim 11, wherein a thickness of an upper one of adjacent two of the conductive layers is larger than a thickness of a lower one of the adjacent two of the conductive layers.

\*    \*    \*    \*    \*